(12) United States Patent
Recchia et al.

(10) Patent No.: US 8,524,442 B1
(45) Date of Patent: Sep. 3, 2013

(54) INTEGRATED MEMBRANE LAMINATION AND UV EXPOSURE SYSTEM AND METHOD OF THE SAME

(76) Inventors: David A. Recchia, Smyrna, GA (US);
Kyle P. Baldwin, Acworth, GA (US);
Timothy Gotsick, Acworth, GA (US)

( * ) Notice: Subject to any disclaimer, the term of this patent is extended or adjusted under 35 U.S.C. 154(b) by 34 days.

(21) Appl. No.: 13/372,060

(22) Filed: Feb. 13, 2012

(51) Int. Cl.
*G03C 5/00* (2006.01)

(52) U.S. Cl.
USPC ........... 430/296; 430/300; 430/302; 430/323; 430/327; 430/330; 430/942; 430/945; 355/53

(58) Field of Classification Search
USPC .................. 430/296, 300, 302, 323, 327, 330, 430/942, 945; 355/53
See application file for complete search history.

(56) References Cited

U.S. PATENT DOCUMENTS

| | | | |
|---|---|---|---|
| 3,265,765 A | 8/1966 | Holden et al. |
| 3,867,153 A | 2/1975 | MacLachlan |
| 4,264,705 A | 4/1981 | Allen |
| 4,320,188 A | 3/1982 | Heinz et al. |
| 4,323,636 A | 4/1982 | Chen |
| 4,323,637 A | 4/1982 | Chen et al. |
| 4,369,246 A | 1/1983 | Chen et al. |
| 4,423,135 A | 12/1983 | Chen et al. |
| 4,427,759 A | 1/1984 | Gruetzmacher et al. |
| 4,522,497 A | 6/1985 | Ikin |
| 4,622,088 A | 11/1986 | Min |
| 5,135,827 A | 8/1992 | Bohm et al. |
| 5,215,859 A | 6/1993 | Martens |
| 5,223,375 A | 6/1993 | Berrier et al. |
| 5,262,275 A | 11/1993 | Fan |
| 5,669,048 A | 9/1997 | Nishio et al. |
| 5,719,009 A | 2/1998 | Fan |
| 5,925,500 A | 7/1999 | Yang |
| 6,106,139 A | 8/2000 | Sugiyama |
| 6,238,837 B1 | 5/2001 | Fan |
| 6,262,825 B1 | 7/2001 | Mueller et al. |
| 6,599,954 B1 | 7/2003 | Hayashi et al. |
| RE39,835 E | 9/2007 | Kanga |
| 2001/0053498 A1 | 12/2001 | Fujimoto et al. |
| 2002/0058196 A1 | 5/2002 | Kanga |
| 2004/0038147 A1 | 2/2004 | Ray |
| 2005/0227182 A1 | 10/2005 | Ali et al. |
| 2009/0000735 A1 | 1/2009 | Zwadlo et al. |
| 2011/0079158 A1 | 4/2011 | Recchia |
| 2011/0081614 A1 | 4/2011 | Recchia |

FOREIGN PATENT DOCUMENTS

| | | |
|---|---|---|
| EP | 0 456 336 | 11/1991 |
| EP | 0 640 878 | 3/1995 |
| GB | 1 366 769 | 9/1974 |

*Primary Examiner* — Christopher Young
(74) *Attorney, Agent, or Firm* — Carmody & Torrance LLP

(57) ABSTRACT

A combined laminating and exposing apparatus for exposing a photosensitive printing blank to actinic radiation in a printing plate manufacturing system and a method of using the same are disclosed. The photosensitive printing blank comprises a backing layer, at least one photocurable layer disposed on the backing layer, and a laser ablatable mask layer disposed on the at least one photocurable layer, wherein the laser ablatable mask layer is laser ablated to create an in situ negative in the laser ablatable mask layer. The exposing apparatus comprises: (a) a laminating apparatus for laminating an oxygen barrier layer to a top of the laser ablated mask layer; (b) a conveyor; (c) a first exposing device for imagewise exposing the at least one photocurable layer to actinic radiation, and (d) a second exposing device for exposing the at least one photocurable layer to actinic radiation through the backing layer.

33 Claims, 2 Drawing Sheets

INTEGRATED MEMBRANE LAMINATION AND UV EXPOSURE SYSTEM AND METHOD OF THE SAME

FIELD OF THE INVENTION

The present invention relates generally to a combined lamination and exposure system for use in manufacturing relief image printing elements.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

A typical flexographic printing plate as delivered by its manufacturer is a multilayered article made of, in order, a backing or support layer; one or more unexposed photocurable layers; optionally a protective layer or slip film; and often, a protective cover sheet.

The support (or backing) layer lends support to the plate. The support layer can be formed from a transparent or opaque material such as paper, cellulose film, plastic, or metal. Preferred materials include sheets made from synthetic polymeric materials such as polyesters, polystyrene, polyolefins, polyamides, and the like. One widely used support layer is a flexible film of polyethylene terephthalate.

The photocurable layer(s) can include any of the known photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may also be used.

Photocurable materials generally cross-link (cure) and harden through radical polymerization in at least some actinic wavelength region. As used herein, the term "photocurable material" refers to a solid composition which undergoes polymerization, cross-linking, or any other curing or hardening reaction in response to actinic radiation with the result that the unexposed portions of the material can be selectively separated and removed from the exposed (cured) portions to form a three dimensional or relief pattern of cured material. As used herein, "actinic radiation" is radiation capable of polymerizing, crosslinking or curing the photocurable layer. Actinic radiation includes, for example, amplified (e.g., laser) and non-amplified light, particularly in the UV and violet wavelength regions.

The slip film is a thin layer, which protects the photopolymer from dust and increases its ease of handling. In a conventional ("analog") plate making process, the slip film is transparent to UV light, and the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate.

In a "digital" or "direct to plate" plate making process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are then ablated by exposing the masking layer to laser radiation at a selected wavelength and power of the laser. Examples of laser ablatable layers are disclosed, for example, in U.S. Pat. No. 5,925,500 to Yang, et al., and U.S. Pat. Nos. 5,262,275 and 6,238,837 to Fan, the subject matter of each of which is herein incorporated by reference in its entirety.

Processing steps for forming relief image printing elements typically include the following:

1) Image generation, which may be mask ablation for digital "computer to plate" plates or negative production for conventional analog plates;
2) Back exposure to create a floor layer in the photocurable layer and establish the depth of relief;
3) Face exposure through the mask (or negative) to selectively crosslink and cure portions of the photocurable layer not covered by the mask, thereby creating the relief image;
4) Developing to remove unexposed photopolymer by solvent (including water) or thermal development; and
5) If necessary, post exposure and detackification.

Removable coversheets are typically provided to protect the photocurable printing element from damage during transport and handling. Prior to processing the printing elements, the coversheet(s) are removed and the photosensitive surface is exposed to actinic radiation in an imagewise fashion. Upon imagewise exposure to actinic radiation, polymerization, and hence, insolubilization of the photopolymerizable layer occurs in the exposed areas. Treatment with a suitable developer (or thermal development) removes the unexposed areas of the photopolymerizable layer, leaving a printing relief that can be used for flexographic printing.

As used herein "back exposure" is a blanket exposure to actinic radiation of the photopolymerizable layer on the side opposite that which does, or ultimately will, bear the relief. This step is typically accomplished through a transparent support layer and is used to create a shallow layer of photocured material, i.e., the "floor," on the support side of the photocurable layer. The purpose of the floor is generally to sensitize the photocurable layer and to establish the depth of relief.

Following this brief back exposure step (i.e., typically brief as compared to the imagewise exposure step which follows), an imagewise exposure is performed utilizing a digitally-imaged mask or a photographic negative mask, which is in contact with the photocurable layer and through which actinic radiation is directed.

The type of radiation used is dependent on the type of photoinitiator in the photopolymerizable layer. The digitally-imaged mask or photographic negative prevents the material beneath from being exposed to the actinic radiation and hence those areas covered by the mask do not polymerize. The areas not covered by the mask are exposed to actinic radiation and polymerize. Any conventional sources of actinic radiation can be used for this exposure step. Examples of suitable visible and UV sources include carbon arcs, mercury-vapor arcs, fluorescent lamps, electron flash units, electron beam units and photographic flood lamps.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or heat plus a blotter. The resulting surface has a relief pattern that reproduces the image to be printed. The relief pattern typically comprises a plurality of dots, and the shape of the dots and the depth of the relief, among other factors, affect the quality of the printed image. After the relief image is developed, the relief image printing element may be mounted on a press and printing commenced.

The shape of the dots and the depth of the relief, among other factors, affect the quality of the printed image. It is very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas.

Maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (the dot is not "held" on plate and/or on press). Alternatively, if the dots survive processing they are susceptible to damage on press. For example small dots often fold over and/or partially break off during printing, causing either excess ink or no ink to be transferred.

Furthermore, photocurable resin compositions typically cure through radical polymerization upon exposure to actinic radiation. However, the curing reaction can be inhibited by molecular oxygen, which is typically dissolved in the resin compositions, because the oxygen functions as a radical scavenger. It is therefore highly desirable for the dissolved oxygen to be removed from the resin composition before image-wise exposure so that the photocurable resin composition can be more rapidly and uniformly cured.

As described in related patent application Ser. No. 12/571,523 to Recchia and Ser. No. 12/660,451 to Recchia et al., the subject matter of each of which is herein incorporated by reference in its entirety, it has been found that a particular set of geometric characteristics define a flexo dot shape that yields superior printing performance, including but not limited to (1) planarity of the dot surface; (2) shoulder angle of the dot; (3) depth of relief between the dots; and (4) sharpness of the edge at the point where the dot top transitions to the dot shoulder. An important method of beneficially changing and/or tailoring the shape of printing dots formed on a printing element is accomplished by limiting the diffusion of air into the photocurable layer. As described in related patent application Ser. No. 13/205,107 to Gotsick et al., the subject matter of which is herein incorporated by reference in its entirety, the use of a barrier layer, such as an oxygen barrier membrane during the imaging and exposing steps produces printing dots having at least one of the particular set of geometric characteristic that is beneficially changed in relation to dots formed without the use of a barrier layer.

The inventors of the present invention have determined that it would be desirable to automate the exposure process to reduce the time requirement of the platemaking process and to create printing dots having desirable geometric characteristics and other features.

In addition, the inventors of the present invention have also determined that it would be desirable to combine a laminating step with the automated exposure process to further streamline the platemaking process and to produce relief image printing elements having desirable geometric characteristics and other features.

SUMMARY OF THE INVENTION

It is an object of the present invention to automate production of digital relief image printing elements by means of a simultaneous face and back exposures step.

It is another object of the present invention to allow for the simultaneous face and back exposure of digital relief image printing elements after lamination of an oxygen barrier layer to a relief image printing element.

It is another object of the present invention to provide a combined laminating and exposure system comprising a laminating station and an exposure station capable of simultaneously performing front and back exposure of a relief image printing element.

It is still another object of the present invention to create printing dots having desirable geometric characteristics.

It is still another object of the present invention to provide means of attenuating the actinic radiation in the back exposure step in order to reduce the intensity of the actinic radiation.

To that end, in one embodiment, the present invention relates generally to a method of exposing a photosensitive printing blank to actinic radiation in a printing plate manufacturing process, wherein the photosensitive printing blank comprises a backing layer, at least one photocurable layer disposed on the backing layer, and a laser ablatable mask layer disposed on the at least one photocurable layer, wherein the laser ablatable mask layer is laser ablated to create an in situ negative in the laser ablatable mask layer, the method comprising the steps of:

a) laminating an oxygen barrier layer to a top of the laser ablated mask layer using heat and pressure;

b) conveying the photosensitive printing blank into an exposing unit, wherein said exposing unit is capable of crosslinking and curing portions of the at least one photocurable layer not covered by the laser ablated mask layer and creating a crosslinked floor layer in the at least one photocurable layer; and c) at least substantially simultaneously (i) exposing the at least one photocurable layer to actinic radiation from a first source of actinic radiation through the laser ablated mask layer and the oxygen barrier layer to selectively crosslink and cure portions of the at least one photocurable layer not covered by the mask layer, and (ii) exposing the at least one photocurable layer to actinic radiation from a second source of actinic radiation through the backing layer to create a crosslinked floor layer in the photocurable layer.

In another embodiment, the present invention relates generally to an exposing apparatus for exposing a photosensitive printing blank to actinic radiation in a printing plate manufacturing system, wherein the photosensitive printing blank comprises a backing layer, at least one photocurable layer disposed on the backing layer, and a laser ablatable mask layer disposed on the at least one photocurable layer, wherein the laser ablatable mask layer is laser ablated to create an in situ negative in the laser ablatable mask layer, the exposing apparatus comprising:
 a) a laminating apparatus for laminating an oxygen barrier layer to a top of the laser ablated mask layer;
 b) a conveyor for conveying the photosensitive printing blank through the exposing apparatus;
 c) a first exposing device for exposing the at least one photocurable layer to actinic radiation from the first exposing device through the laser ablated mask layer and the oxygen barrier layer to selectively crosslink and cure portions of the at least one photocurable layer not covered by the mask layer, and
 d) a second exposing device for exposing the at least one photocurable layer to actinic radiation from the second exposing device through the backing layer to create a crosslinked floor layer in the photocurable layer,
 wherein said first exposing device and said second exposing device operate substantially simultaneously.

BRIEF DESCRIPTION OF THE FIGURES

The above set forth and other features of the invention are made more apparent in the ensuing Detailed Description of the Preferred Embodiments when read in conjunction with the attached Drawings, wherein.

Identical reference numerals in the figures are intended to indicate like parts, although not every feature in every figure may be called out with a reference numeral.

DETAILED DESCRIPTION OF THE PREFERRED EMBODIMENTS

Figure 1:
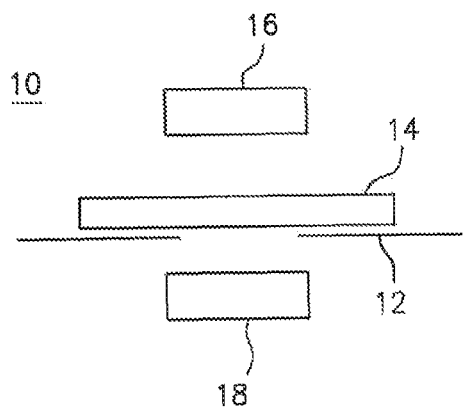
FIG. 1 depicts an exposure step with a simultaneous face and back exposure step in accordance with the present invention.

The present invention describes a conveyorized exposure system that is capable of at least substantially simultaneously performing both a face exposure and a back exposure of a photosensitive printing blank in a flexographic platemaking process and a method of using the same. Furthermore, the present invention also describes a combined laminating and exposure system to further streamline the platemaking process and to create printing dots having desirable geometric characteristics and a method of using the same.

In one preferred embodiment, the present invention relates generally to a method of exposing a photosensitive printing blank to actinic radiation in a printing plate manufacturing process to crosslink and cure portions of the at least one photocurable layer, thereby creating the relief layer while simultaneously back exposing the at least one photocurable layer to actinic radiation through the backing layer to create a floor layer and set the depth of relief.

The photosensitive printing blank comprises a backing layer, at least one photocurable layer disposed on the backing layer, and a laser ablatable mask layer disposed on the at least one photocurable layer, and the laser ablatable mask layer is laser ablated to create an in situ negative in the laser ablatable mask layer.

The laser ablatable mask layer can be any photoablative mask layer known in the art. Such mask layers include those that can be ablated by any type of laser known to those skilled in the art such as, for example, UV-type Eximer lasers typically operating at wavelengths of about 300 to 400 nm; IR-type lasers such as, for example, $CO_2$ lasers typically operating at a wavelength of about 10,640 nm; Nd-YAG lasers typically operating at a wavelength of about 1064 nm; and diode array lasers typically operating at a wavelength of about 830 nm.

The method generally comprises the steps of:
 a) laminating an oxygen barrier layer to a top of the laser ablated mask layer using heat and pressure;
 b) conveying the photosensitive printing blank into an exposing unit, wherein said exposing unit is capable of crosslinking and curing portions of the at least one photocurable layer not covered by the laser ablated mask layer and creating a crosslinked floor layer in the at least one photocurable layer; and
 c) at least substantially simultaneously:
  (i) exposing the at least one photocurable layer to actinic radiation from a first source of actinic radiation through the laser ablated mask layer and the oxygen barrier layer to selectively cross link and cure portions of the at least one photocurable layer not covered by the mask layer, and
  (ii) exposing the at least one photocurable layer to actinic radiation from a second source of actinic radiation through the backing layer to create a crosslinked floor layer in the photocurable layer.

As described herein, the oxygen barrier layer is laminated to the top of the laser ablated mask layer using heat and pressure prior to the step of exposing the at least one photocurable layer to actinic radiation. The photosensitive printing blank is thus exposed to actinic radiation from the first source of actinic radiation through the laser ablated mask layer and the oxygen barrier layer.

The laminating step typically comprises the steps of:
 a) supplying the photosensitive printing blank to a nip formed between a heated laminating roller and a second roller;
 b) supplying the oxygen barrier layer from a oxygen barrier layer supply roller over an outer surface of the heated laminating roller and into the nip formed between the heated laminating roller and the second roller; wherein the oxygen barrier layer contacts a top surface of the photosensitive printing blank at a point where the photosensitive printing blank advances through the nip; and
 c) rotating the heated laminating roller in a first direction and the second roller in an opposite direction to advance the photosensitive printing blank with the oxygen barrier layer thereon through the nip, thereby laminating the oxygen barrier layer to the top of the laser ablated mask layer.

After the oxygen barrier layer is laminated to the top of the laser ablatable mask layer and the photosensitive printing blank has been exposed to actinic radiation, the oxygen barrier layer is removed. It is also generally preferred that the oxygen barrier layer be removed prior to the development step.

The conveying speed of the photosensitive printing blank through the laminating step and the exposing unit is typically between about 0.5 and 5 feet per minute.

Next, the imaged and exposed photosensitive printing blank is developed to reveal the relief image therein that comprises a plurality of relief dots. Development may be accomplished by various methods, including water development, solvent development and thermal development, by way of example and not limitation. Finally, the relief image printing element is mounted on a printing cylinder of a printing press and printing is commenced.

As described in related application Ser. No. 12/571,523 to Recchia and Ser. No. 12/660,451 to Recchia et al., the presence of the oxygen barrier layer produces printing dots having at least one geometric characteristic selected from the group consisting of planarity of a top surface of the printing dots, shoulder angle of the printing dots and edge sharpness of the printing dots, beneficially changed in relation to dots formed without the use of a barrier layer.

The photocurable materials of the invention should crosslink (cure) and, thereby, harden in at least some actinic wavelength region. As used herein, actinic radiation is radiation capable of effecting a chemical change in an exposed moiety.

In one embodiment, the first source of actinic radiation is selected from visible and UV sources including carbon arcs, mercury-vapor arcs, fluorescent lamps, electron flash units, electron beam units and photographic flood lamps, although other similar sources of actinic radiation that emit at a wavelength in the desired range would also be usable in the practice of the invention. Preferred actinic wavelength regions are from about 250 nm to about 450 nm, more preferably from about 300 nm to about 400 nm, even more preferably from about 320 nm to about 380 nm. Furthermore, the intensity of flood exposure lamps used in the curing of flexographic printing plates is typically in the range of about 5-25 milliwatts/$cm^2$, but intensities can be as high as 50 milliwatts/$cm^2$.

The second source of actinic radiation is also preferably selected from visible and UV sources including carbon arcs, mercury-vapor arcs, fluorescent lamps, electron flash units, electron beam units and photographic flood lamps. As with the first source of actinic radiation, other similar sources of actinic radiation that emit at a wavelength in the desired range would also be usable in the practice of the invention. The second source of actinic radiation also preferably emits at a wavelength in the range of from about 250 nm to about 450 nm.

As described herein, the photosensitive printing blank is exposed to actinic radiation from the first source of actinic radiation through the in situ negative. In a preferred embodiment, the photosensitive printing blank is exposed to actinic radiation for between about 1 and about 20 minutes, more preferably, for between about 4 and about 10 minutes. In addition, the photosensitive printing blank is exposed to actinic radiation through the backing layer from the second source of actinic radiation for between about 0.5 and about 5 minutes, more preferably for between about 1 and about 3 minutes.

In order for the face exposure step and the back exposure step to be performed at least substantially simultaneously and to adequate crosslink and cure both the floor layer and the relief layer, the second source of actinic radiation is preferably attenuated. In this instance, it is desirable that the at least one photocurable layer absorbs 80% to 99% of the actinic radiation emitted by the second source of actinic radiation The second source of actinic radiation may be attenuated by any one of a variety of methods. For example, the second source of actinic radiation may be attenuated by a method selected from the group consisting of positioning a shutter between the second source of actinic radiation and the backing layer, by positioning a filter between the second source of actinic radiation and the backing layer, by use of a second source of actinic radiation that emits at a less efficient UV wavelength, by use of a backing layer that absorbs a portion of the actinic radiation emitted by the second source of actinic radiation and combinations of one or more of the foregoing.

In one embodiment, the second source of actinic radiation is attenuated by positioning a shutter between the second source of actinic radiation and the backing layer. For example, the shutter may be any material opaque to actinic radiation that has the physical properties needed for repeated exposure to actinic radiation and mechanical properties needed for being positioned between the actinic radiation source and the photopolymer plate. General examples of suitable shutter designs would be retractable shields that accordion or roll up when not in use, or louver-type shutters that remain in place, but can be mechanically manipulated so that very little actinic radiation is blocked when they are 'open'. A suitable shutter for use in the practice of the invention would be light duty commercial louvers, available from North Coast Tool (Erie, Pa.).

In another embodiment, the second source of actinic radiation is attenuated by positioning a filter between the second source of actinic radiation and the backing layer. In particular, a light attenuating filter may be used which adjusts the amount (intensity) of light illuminated on the backing layer. The light attenuating filter is selected so as to have a particular transmittance. For example, the light attenuating filter may have a transmittance of 80% so that the light passing through the filter is attenuated by 20%. A suitable light attenuating filter for use in the practice of the invention would be a UV-blocking PET film, available from DuPont Teijin Films under the tradename Melinex 626.

In yet another embodiment, the second source of actinic radiation is of a different, less efficient UV wavelength to allow the use of a non-UV-blocking polyester as the backing layer on the plate because attenuation would no longer be needed. Photoinitiators dispersed in the at least one photocurable layer typically have a wavelength (or range of wavelengths) at which they are effective. Choosing a wavelength for the second source of actinic radiation that is less efficient allows for the use of additional non-UV-blocking backing layers to be used.

In still another embodiment, the second source of actinic radiation is attenuated by using a backing or support layer that absorbs a portion of the actinic radiation emitted by the second source of actinic radiation. As described in U.S. Pat. No. RE39,835 to Kanga, the subject matter of which is herein incorporated by reference in its entirety, a modification may be made to the support layer, to allow printers to better control floor-formation in digital platemaking processes.

As described above, the support layer of the photocurable element is preferably formed from a variety of flexible, transparent materials. The support layer may be made UV-absorbing either by forming the support layer from a material that is inherently UV-absorbing, i.e., attenuates actinic radiation itself, or by adding a dopant to the material forming the support layer.

Support layers that are inherently UV-absorbing include polyethylene naphthalate (PEN) (for example, Kaladex 1030 and Kaladex 2000 commercially available from DuPont PET, Hopewell, Va.). When an inherently UV-absorbing support layer is used, the percent of actinic radiation that is absorbed is a function of the thickness of the support layer. For example, a PEN support layer having a thickness of about 5 mils typically absorbs about 97 percent of actinic radiation; a PEN support layer having a thickness of about 3 mils typically absorbs about 95 percent of actinic radiation.

Support layers that contain a UV-absorbing material typically have a UV-absorbing dopant added to the support layer during manufacture. The spectral range of the flood-exposure lamps used in many applications is about 300-400 nm. Based thereon, the UV absorbing dopant should typically be active in this range. Preferably, the presence of the UV absorber changes a normally UV transparent support layer into an attenuation tool that absorbs at least a portion of the UV radiation that passes through it. Preferably, the support absorbs between about 80 to 99%, more preferably between about 85 to about 95%, and most preferably about 88% of actinic radiation.

Depending on the method selected for attenuating the second source of actinic radiation, first source of actinic radiation and the second source of actinic radiation may emit at substantially the same wavelength or may emit at different wavelengths.

A wide range of materials can serve as the oxygen barrier layer, including various oxygen barrier films and membranes. Three qualities that have been identified in producing effective oxygen barrier layer include optical transparency, low thickness and oxygen transport inhibition. Oxygen transport inhibition is measure in terms of a low oxygen diffusion coefficient. As noted, the oxygen diffusion coefficient of the oxygen barrier layer should be less than $6.9 \times 10^{-9}$ m$^2$/sec., preferably less than $6.9 \times 10^{-10}$ m$^2$/sec. and most preferably less than $6.9 \times 10^{-11}$ m$^2$/sec.

Examples of materials which are suitable for use as the oxygen barrier layer include those materials that are conventionally used as a release layer in flexographic printing elements, such as polyamides, polyvinyl alcohol, hydroxyalkyl cellulose, copolymers of ethylene and vinyl acetate, amphoteric interpolymers, cellulose acetate butyrate, alkyl cellulose, butyral, cyclic rubbers, and combinations of one or more of the foregoing. In addition, films such as polypropylene, polyethylene, polyvinyl chloride, polyester and similar clear films can also serve well as barrier layers. In one preferred embodiment, the oxygen barrier layer comprises a polypropylene film or a polyethylene terephthalate film.

The thickness of the oxygen barrier layer should be consistent with the structural needs for handling of the film and the film/photopolymer plate combination. Barrier thicknesses between about 5 and 300 microns are preferred, more preferably between about 10 to about 200 microns and most preferably between about 1 to about 20 microns.

The oxygen barrier layer also needs to have a sufficient optical transparency so that the oxygen barrier membrane will not detrimentally absorb or deflect the actinic radiation used to expose the photosensitive printing blank. As such it is preferable that the oxygen barrier layer have an optical transparency of at least 50%, most preferably at least 75%.

The oxygen barrier layer also needs to be sufficiently impermeable to oxygen diffusion so that it can effectively limit diffusion of oxygen into the photocurable layer during exposure to actinic radiation.

As discussed above, related patent application Ser. No. 12/571,523 to Recchia, Ser. No. 12/660,451 to Recchia et al., and Ser. No. 13/205,107 to Gotsick et al., the subject matter of each of which is herein incorporated by reference in its entirety, describe the particular set of geometric characteristics define a flexo dot shape that yields superior printing performance, including but not limited to (1) planarity of the dot surface; (2) shoulder angle of the dot; (3) depth of relief between the dots; and (4) sharpness of the edge at the point where the dot top transitions to the dot shoulder.

In another preferred embodiment, the present invention also relates generally to a combined laminating and exposing apparatus for exposing a photosensitive printing blank to actinic radiation in a platemaking system. As described above, the photosensitive printing blank comprises a backing layer, at least one photocurable layer disposed on the backing layer, and a laser ablatable mask layer disposed on the at least one photocurable layer, and the laser ablatable mask layer is laser ablated to create an in situ negative in the laser ablatable mask layer.

Figure 2:
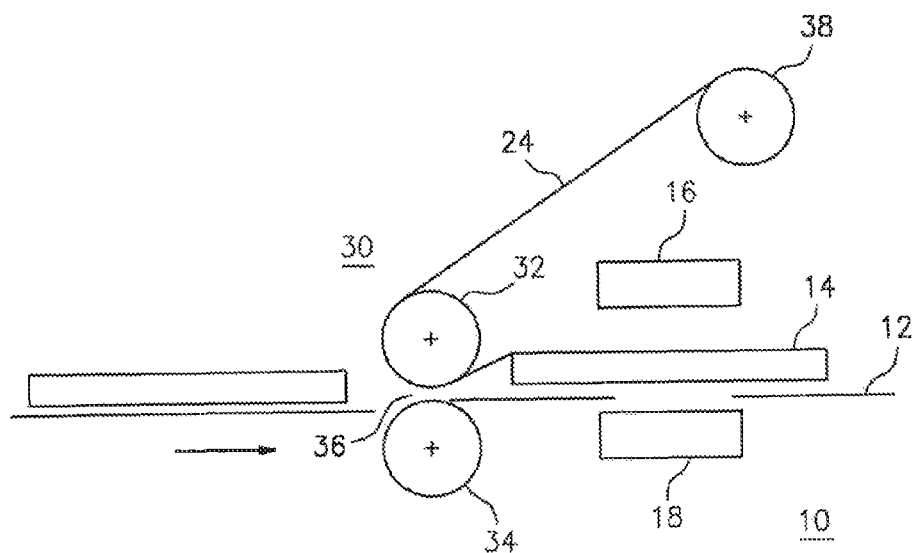
FIG. 2 depicts an integrated laminating and exposure system in accordance with the present invention.
Figure 3:
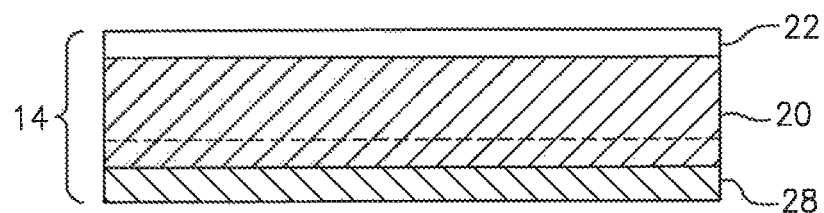
FIG. 3 depicts a photosensitive printing blank that is processible through the laminating and exposure system of the present invention.

As shown in FIGS. 1 and 2, the exposing apparatus 10 preferably comprises:

a) a laminating apparatus 30 for laminating an oxygen barrier layer 24 to a top of the laser ablated mask layer 22;

b) a conveyor 12 for conveying the photosensitive printing blank 14 through the exposing apparatus;

c) a first exposing device 16 for exposing the at least one photocurable layer 20 (shown in FIG. 3) to actinic radiation from the first exposing device 16 through the laser ablated mask layer 22 and the oxygen barrier layer 24 to selectively crosslink and cure portions of the at least one photocurable layer 20 not covered by the mask layer 22, and d) a second exposing device 18 for exposing the at least one photocurable layer 20 to actinic radiation from the second exposing device 18 through the backing layer 28 to create a crosslinked floor layer in the photocurable layer 20, wherein said first exposing device 16 and said second exposing device 18 operate substantially simultaneously.

As described herein, the second exposure device 18 may comprise an attenuating mechanism for the second exposure device, whereby an intensity in the actinic radiation from the second exposing device is reduced.

In one embodiment, the attenuating mechanism may comprise a shutter. One suitable shutter is a light duty commercial louver, available from North Coast Tool (Erie, Pa.). Other suitable shutters that are capable of attenuating the intensity of actinic radiation from the second exposing device, including for example any material opaque to actinic radiation that has the physical properties needed for repeated exposure to actinic radiation and mechanical properties needed for being positioned between the actinic radiation source and the photopolymer plate. General examples of suitable shutter designs would be retractable shields that accordion or roll up when not in use, or louver-type shutters that remain in place, but can be mechanically manipulated so that very little actinic radiation is blocked when they are 'open', would also be usable in the practice of the invention.

In another embodiment, the attenuating mechanism may comprise a filter. One suitable filter is available from DuPont Teijin Films under the tradename Melinex 628 Other suitable filters that are capable of attenuating the intensity of actinic radiation from the second exposing device, including for example a matte or translucent film would also be usable in the practice of the invention.

Figure 4:
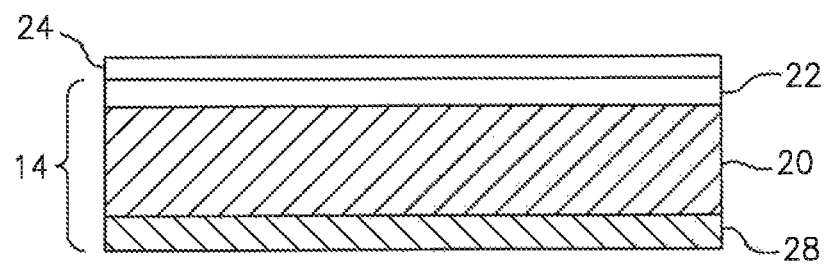
FIG. 4 depicts a photosensitive printing blank with an oxygen barrier layer laminated thereon that is processible through the exposure system of the present invention.

As shown in FIG. 4, the photosensitive printing blank 14 with the oxygen barrier layer 24 mounted thereon thus comprises a backing layer 28, at least one photocurable layer 20 disposed on the backing layer 28 and a laser ablatable mask layer 22 disposed on the at least one photocurable layer 20.

As shown in FIG. 2, the laminating apparatus 30 typically comprises:
a. a heated laminating roller 32 and a second roller 34, wherein said heated laminating roller 32 and said second roller 34 are opposably mounted and form a nip 36 therebetween for receiving the photosensitive printing blank 14 to be laminated;
b. a drive mechanism for rotating the heated laminating roller 32 and second roller 34, wherein the heated laminating roller 32 is rotated in a first direction and the second roller 34 is rotated in an opposite direction to advance the photosensitive printing blank 14 through the nip 36 formed between the heated laminating roller 32 and second roller 34; and
c. a supply roller 38 adapted to support the roll of oxygen barrier layer 24 and supply the oxygen barrier layer 24 over an outer surface of the heated laminating roller 32 and into the nip 36 formed between the heated laminating roller 32 and the second roller 34, wherein the oxygen barrier layer 24 is contactable with a top surface of the photosensitive printing blank 14 at a point where the photosensitive printing blank 14 advances through the nip 36.

The present invention allows for the full automation of simultaneous exposure along with the production of flat top dots. The present invention can also be used to automate the production of standard digital relief image printing elements by means of a simultaneous face and back exposure.

What is claimed is:

1. A method of exposing a photosensitive printing blank to actinic radiation in a printing plate manufacturing process, wherein the photosensitive printing blank comprises a backing layer, at least one photocurable layer disposed on the backing layer, and a laser ablatable mask layer disposed on the at least one photocurable layer, wherein the laser ablatable mask layer is laser ablated to create an in situ negative in the laser ablatable mask layer, the method comprising the steps of:
   a) laminating an oxygen barrier layer to a top of the laser ablated mask layer using heat and pressure;
   b) conveying the photosensitive printing blank into an exposing unit, wherein said exposing unit is capable of crosslinking and curing portions of the at least one photocurable layer not covered by the laser ablated mask layer and creating a crosslinked floor layer in the at least one photocurable layer; and
   c) at least substantially simultaneously (i) exposing the at least one photocurable layer to actinic radiation from a first source of actinic radiation through the laser ablated mask layer and the oxygen barrier layer to selectively crosslink and cure portions of the at least one photocurable layer not covered by the mask layer, and (ii) exposing the at least one photocurable layer to actinic radiation from a second source of actinic radiation through the backing layer to create a crosslinked floor layer in the photocurable layer.

2. The method according to claim 1, wherein the step of laminating the oxygen barrier layer to the top of the laser ablated mask layer comprises the steps of:
   a. supplying the photosensitive printing blank to a nip formed between a heated laminating roller and a second roller;
   b. supplying the oxygen barrier layer from a supply roller over an outer surface of the heated laminating roller and into the nip formed between the heated laminating roller and the second roller; wherein the oxygen barrier layer contacts a top surface of the photosensitive printing blank at a point where the photosensitive printing blank advances through the nip;
   c. rotating the heated laminating roller in a first direction and the second roller in an opposite direction to advance the photosensitive printing blank with the oxygen barrier layer thereon through the nip, thereby laminating the oxygen barrier film to the top of the laser ablated mask layer.

3. The method according to claim 1, wherein after the oxygen barrier layer is laminated to the top of the laser ablatable mask layer and the photosensitive printing blank has been exposed to actinic radiation, the method further comprises the step of removing the oxygen barrier layer.

4. The method according to claim 3, further comprising the step of developing the imaged and exposed photosensitive printing blank to reveal a relief image therein, said relief image comprising a plurality of relief dots;
   wherein the presence of the oxygen barrier layer produces printing dots having at least one geometric characteristic selected from the group consisting of planarity of a top surface of the printing dots, shoulder angle of the printing dots and edge sharpness of the printing dots, beneficially changed in relation to dots formed without the use of the oxygen barrier film.

5. The method according to claim 1, wherein the first source of actinic radiation is selected from visible and UV sources including carbon arcs, mercury-vapor arcs, fluorescent lamps, electron flash units, electron beam units and photographic flood lamps.

6. The method according to claim 1, wherein the first source of actinic radiation emits at a wavelength in the range of from about 250 nm to about 450 nm.

7. The method according to claim 5, wherein the first source of actinic radiation emits at a wavelength in the range of from about 300 to about 400 nm.

8. The method according to claim 7, wherein the first source of actinic radiation emits at a wavelength in the range of from about 320 to about 380 nm.

9. The method according to claim 1, wherein the second source of actinic radiation is selected from visible and UV sources including carbon arcs, mercury-vapor arcs, fluorescent lamps, electron flash units, electron beam units and photographic flood lamps.

10. The method according to claim 1, wherein the second source of actinic radiation emits at a wavelength in the range of from about 250 nm to about 450 nm.

11. The method according to claim 8, wherein the second source of actinic radiation is attenuated, wherein the at least one photocurable layer absorbs 80% to 99% of the actinic radiation emitted by the second source of actinic radiation.

12. The method according to claim 11, wherein the second source of actinic radiation is attenuated by a method selected from the group consisting of positioning a shutter between the second source of actinic radiation and the backing layer, by positioning a filter between the second source of actinic radiation and the backing layer, by use of a second source of actinic radiation that emits at a less efficient UV wavelength, by use of a backing layer that absorbs a portion of the actinic radiation emitted by the second source of actinic radiation and combinations of one or more of the foregoing.

13. The method according to claim 12, wherein the second source of actinic radiation is attenuated by positioning a shutter between the second source of actinic radiation and the backing layer.

14. The method according to claim 12, wherein the second source of actinic radiation is attenuated by positioning a filter between the second source of actinic radiation and the backing layer.

15. The method according to claim 12, wherein the second source of actinic radiation is of a less efficient UV wavelength.

16. The method according to claim 12, wherein the second source of actinic radiation is attenuated by using a backing layer that absorbs a portion of the actinic radiation emitted by the second source of actinic radiation.

17. The method according to claim 16, wherein the backing layer comprises polyethylene naphthalate or doped polyethylene terephthalate.

18. The method according to claim 1, wherein the first source of actinic radiation and the second source of actinic radiation emit at substantially the same wavelength.

19. The method according to claim 1, wherein the first source of actinic radiation and the second source of actinic radiation emit at different wavelengths.

20. The method according to claim 2, wherein the oxygen barrier layer comprises a material selected from the group consisting of polyamides, polyvinyl alcohol, hydroxyalkyl cellulose, copolymers of ethylene and vinyl acetate, amphoteric interpolymers, cellulose acetate butyrate, alkyl cellulose, butyral, cyclic rubbers, polypropylene, polyethylene, polyvinyl chloride, polyester and combinations of one or more of the foregoing.

21. The method according to claim 20, where the oxygen barrier layer has an oxygen diffusion coefficient of less than $6.9 \times 10^{-9}$ m$^2$/sec.

22. The method according to claim 20, wherein the oxygen barrier layer has a thickness of between about 5 and about 300 microns.

23. The method according to claim 20, wherein the oxygen barrier layer has an optical transparency of at least about 50%.

24. The method according to claim 1, wherein the conveying speed of the photosensitive printing blank through the laminating step and the exposing unit is between about 0.5 and 5.0 feet per minute.

25. The method according to claim 1, wherein the photosensitive printing blank is exposed to actinic radiation from the first source of actinic radiation through the in situ negative and the oxygen barrier layer for between about 1 and 20 minutes.

26. The method according to claim 1, wherein the photosensitive printing blank is exposed to actinic radiation through the backing layer from the second source of actinic radiation for between about 1 and 5 minutes.

27. An exposing apparatus for exposing a photosensitive printing blank to actinic radiation in a printing plate manufacturing system, wherein the photosensitive printing blank comprises a backing layer, at least one photocurable layer disposed on the backing layer, and a laser ablatable mask layer disposed on the at least one photocurable layer, wherein the laser ablatable mask layer is laser ablated to create an in situ negative in the laser ablatable mask layer, the exposing apparatus comprising:
  a) a laminating apparatus for laminating an oxygen barrier layer to a top of the laser ablated mask layer;
  b) a conveyor for conveying the photosensitive printing blank through the exposing apparatus;
  c) a first exposing device for exposing the at least one photocurable layer to actinic radiation from the first exposing device through the laser ablated mask layer and the oxygen barrier layer to selectively crosslink and cure portions of the at least one photocurable layer not covered by the mask layer, and
  d) a second exposing device for exposing the at least one photocurable layer to actinic radiation from the second exposing device through the backing layer to create a crosslinked floor layer in the photocurable layer,
  wherein said first exposing device and said second exposing device operate substantially simultaneously.

28. The exposing apparatus according to claim 27, wherein the first exposing device is selected from visible and UV sources including carbon arcs, mercury-vapor arcs, fluorescent lamps, electron flash units, electron beam units and photographic flood lamps.

29. The exposing apparatus according to claim 27, wherein the second exposing device is selected from visible and UV sources including carbon arcs, mercury-vapor arcs, fluorescent lamps, electron flash units, electron beam units and photographic flood lamps.

30. The exposing apparatus according to claim 27, further comprising an attenuating mechanism for the second exposure device, whereby an intensity in the actinic radiation from the second exposing device is reduced.

31. The exposing apparatus according to claim 30, wherein the attenuating mechanism comprises a shutter.

32. The exposing apparatus according to claim 30, wherein the attenuating mechanism comprises a filter.

33. The exposing apparatus according to claim 27, wherein the laminating apparatus comprises:
  a. a heated laminating roller and a second roller, wherein said heated laminating roller and said second roller are opposably mounted and form a nip there between for receiving the photosensitive printing blank to be laminated;
  b. a drive mechanism for rotating the heated laminating roller and second roller, wherein the heated laminating roller is rotated in a first direction and the second roller is rotated in an opposite direction to advance the photosensitive printing blank through the nip formed between the heated laminating roller and second roller; and
  c. a supply roller adapted to support a roll of oxygen barrier layer and supply the oxygen barrier layer over an outer surface of the heated laminating roller and into the nip formed between the heated laminating roller and the second roller, wherein the oxygen barrier layer is contactable with a top surface of the photosensitive printing blank at a point where the photosensitive printing blank advances through the nip.

* * * * *